(12) United States Patent
Peng et al.

(10) Patent No.: US 7,812,426 B2
(45) Date of Patent: Oct. 12, 2010

(54) TSV-ENABLED TWISTED PAIR

(75) Inventors: Mark Shane Peng, Hsin-Chu (TW);
Clinton Chao, Hsin-Chu (TW);
Chao-Shun Hsu, I-Land County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 106 days.

(21) Appl. No.: 12/129,857

(22) Filed: May 30, 2008

(65) Prior Publication Data

US 2009/0294915 A1     Dec. 3, 2009

(51) Int. Cl.
*H01L 29/40* (2006.01)
(52) U.S. Cl. .................. 257/621; 257/E23.174
(58) Field of Classification Search .......... 257/621, 257/E23.174
See application file for complete search history.

(56) References Cited

U.S. PATENT DOCUMENTS 7,167,378 B2 * 1/2007 Yamada ..................... 361/777

FOREIGN PATENT DOCUMENTS

CN      1200010 A     11/1998

OTHER PUBLICATIONS

Johnson, H., et al., "High-Speed Digital Design—A Handbook of Black Magic," 1993, pp. 6-8, Prentice Hall PTR, Upper Saddle, New Jersey.

* cited by examiner

*Primary Examiner*—Thien F Tran
(74) *Attorney, Agent, or Firm*—Slater & Matsil, L.L.P.

(57) ABSTRACT

A through-silicon via (TSV) enabled twisted pair is provided. A pair of complementary conductive lines is provided as a twisted pair. Each of the conductive lines of the twisted pair is formed by alternating conductive sections on opposing sides of a substrate. The alternating conductive sections are electrically coupled by at least in part a TSV. The conductive lines overlap or are entwined such the point at which the conductive lines cross, the conductive lines are on opposing sides of the substrate. The conductive lines are weaved in this manner for the length of the conductive trace.

18 Claims, 4 Drawing Sheets

TSV-ENABLED TWISTED PAIR

TECHNICAL FIELD

The present invention relates generally to semiconductor devices and, more particularly, to using through substrate vias (TSVs) to form twisted pairs on an integrated circuit.

BACKGROUND

Integrated circuits generally comprise electrical traces electrically coupled to electronic devices, such as transistors, capacitors, resistors, and the like. As the size of the integrated circuits decrease, the electrical components, including the electrical traces and the electronic devices, become closer to each other. As is known in the art, a phenomenon referred to as crosstalk may occur wherein a signal transmitted on one line may create an undesired effect on another. This problem becomes increasingly troublesome as circuits shrink and the density of the circuits increase.

One attempt at reducing the effect of crosstalk is to shield the affected traces. In this attempt, critical signals such as clock signals are surrounded or shielded by metal traces and vias that are electrically coupled to ground. In this manner, the shielding tied to ground acts to prevent other electrical signals from reaching or affecting the clock signals. This method, however, requires a significant amount of area to implement and, thus, may require a larger die to implement a given circuit.

In another attempt, a twisted pair for differential signals or for single-ended signal and a reference signal, is created through multiple metal layers. In this attempt, however, the twisted pair has limited tunability in terms of characteristic impedance. Furthermore, the material in the core of the twists is not easily changed and devices cannot be placed in the core to further influence the characteristics of the signal. This attempt also requires additional die space and several metal layers due to the 3D geometry.

Therefore, there is a need for a system and method for preventing or reducing crosstalk that requires less die space.

SUMMARY OF THE INVENTION

These and other problems are generally solved or circumvented, and technical advantages are generally achieved by a system, structure and method of forming a twisted pair in a semiconductor device using through substrate vias (TSVs).

In accordance with an embodiment, an integrated circuit device is provided. The integrated circuit device includes a substrate with a first conductive line and a second conductive line, wherein each of the first conductive line and the second conductive line has alternating sections on opposing sides of the substrate electrically coupled by through-substrate vias. The first conductive line crosses the second conductive line relative to an axis orthogonal to a surface of the substrate when the first conductive line is on a different side of the substrate from the second conductive line.

In accordance with another embodiment, an integrated circuit device having a substrate, a first conductive line, and a second conductive line is provided. The first conductive line has a first section on the first side, a second section on the second side, and a third section on the first side, with the first section being electrically coupled to the second section by a first through-substrate via (TSV) and the second section being electrically coupled to the third section by a second TSV. The second conductive line has a fourth section on the second side, a fifth section on the first side, and a sixth section on the second side, with the fourth section being electrically coupled to the fifth section by a third TSV and the fifth section being electrically coupled to the sixth section by a fourth TSV. The first conductive line and the second conductive line form a twisted pair.

In accordance with yet another embodiment, an integrated circuit device is provided having a substrate, a first electrical path, and a second electrical path. Each of the first electrical path and the second electrical path has alternating sections on opposing sides of the substrate. The first electrical path and the second electrical path alternately overlap each other while on opposing sides of the substrate.

The foregoing has outlined rather broadly the features and technical advantages of an illustrative embodiment in order that the detailed description of the invention that follows may be better understood. Additional features and advantages of an illustrative embodiment will be described hereinafter, which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the illustrative embodiments as set forth in the appended claims.

BRIEF DESCRIPTION OF THE DRAWINGS

For a more complete understanding of the illustrative embodiments, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that an illustrative embodiment provides many applicable inventive concepts that can be embodied in a wide variety of specific contexts. The specific embodiments discussed are merely illustrative of specific ways to make and use the invention, and do not limit the scope of the invention.

Figure 1A:
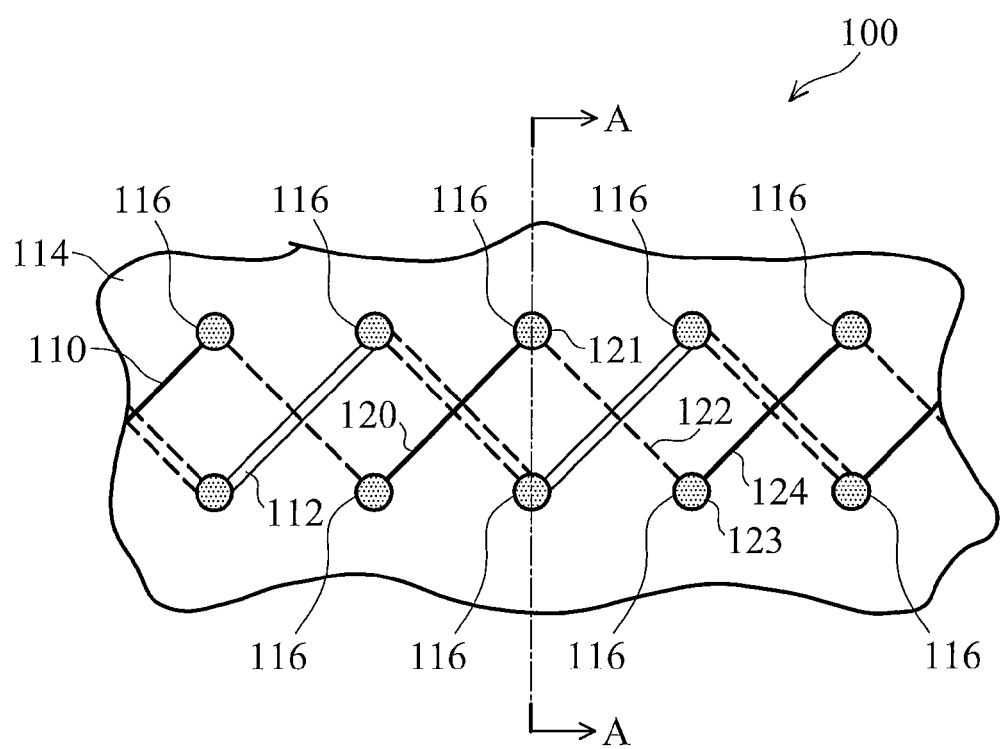
FIGS. 1a and 1b are a plan view and a cross section view, respectively, of a twisted pair using through-substrate vias in accordance with an embodiment of the present invention.
Figure 1B:
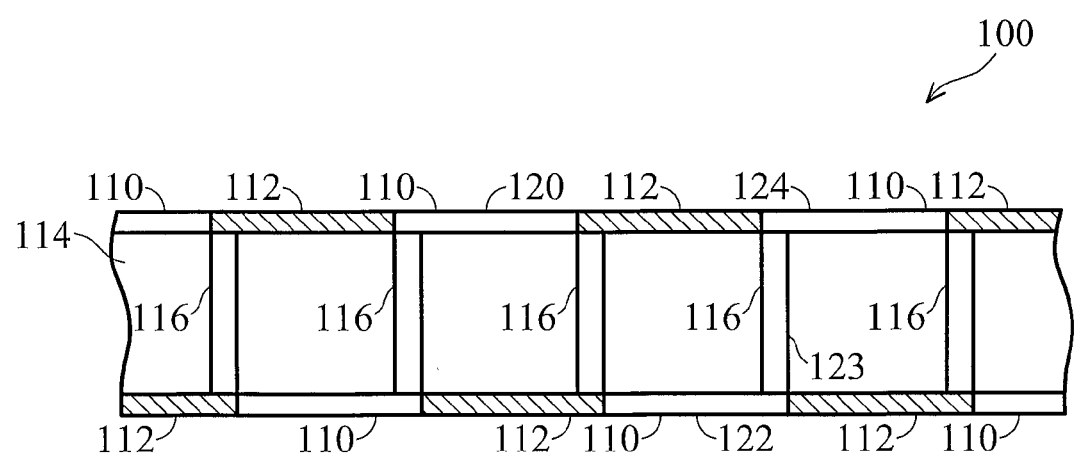

With reference now to FIGS. 1a and 1b, a top view and a side view, respectively, are shown of a twisted pair 100 in accordance with an embodiment of the present invention. The twisted pair 100 includes a first conductive line 110 and a second conductive line 112 such that each of the first conductive line 110 and the second conductive line 112 include alternating sections of conductive trace on the opposing sides of a substrate 114. For illustrative purposes, the first conductive line 110 is illustrated as a single line and the second conductive line 112 is illustrated as a double line in FIG. 1*a*, and the first conductive line 110 is illustrated as an unfilled rectangle and the second conductive line 112 is illustrated as a rectangle with cross-hatching in FIG. 1*b*. Dashed lines in FIG. 1*a* represent traces along the side of the substrate opposing the circuit side of the substrate 114. Circles 116 represent through-substrate vias (TSVs), and possibly vias interconnecting metal layers, electrically coupling conductive traces on opposing sides of the substrate 114.

As illustrated in FIGS. 1*a* and 1*b*, the first conductive line 110 comprises a first section 120 extending over a first surface of the substrate 114. The first section 120 is electrically coupled to a second section 122 that extends over a second (opposing) surface of the substrate 114 by a first TSV 121. The second section 122 is electrically coupled to a third section 124 that extends over the first surface of the substrate by a second TSV 123. This process is repeated to extend the first conductive line 110 in either direction for the desired length. It should be noted that the TSV 121 of FIG. 1*a* does not appear in FIG. 1*b*, because the TSV 121 is behind the TSV shown in FIG. 1*b*.

Similarly, the second conductive line 112 also comprises alternating sections located on opposing sides of the substrate 114 interconnected by TSVs and/or one or more vias and interposed metal layers.

As one of ordinary skill in the art will appreciate, the twisted pair 100 is formed by the entwining of the first conductive line 110 and the second conductive line 112. The first conductive line 110 crosses the second conductive line 112 (as viewed from a point along an axis orthogonal to a major surface of the substrate 114 or the plan view) when the first conductive line 110 and the second conductive line 112 are on opposing sides of the substrate. In this manner, the substrate prevents the first conductive line 110 from contacting the second conductive line 112 when crossing.

Figure 2:
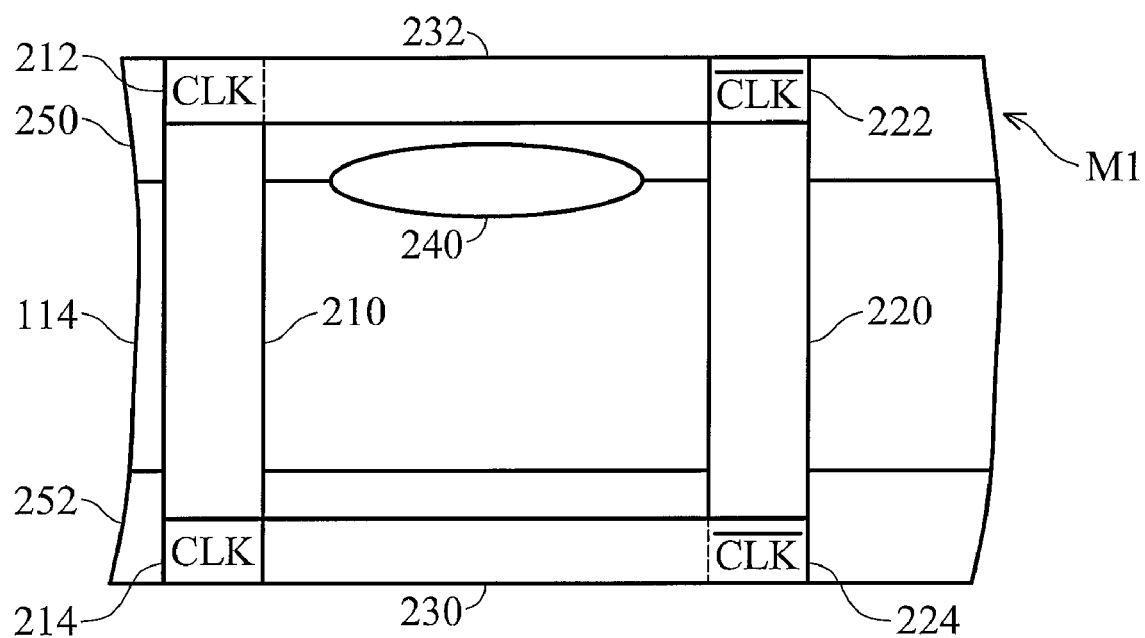
FIG. 2 is a cross section view of a portion of a twisted pair using through substrate vias in accordance with an embodiment of the present invention.

FIG. 2 is a cross section of a portion of the twisted pair 100 along the A-A line in FIG. 1*a* in accordance with an embodiment of the present invention. In this embodiment, the twisted pair 100 comprises complementary signals, such as a clock signal CLK and a complementary clock signal $\overline{\text{CLK}}$. A first TSV 210 is electrically coupled to a first CLK contact 212 positioned on a circuit side of a substrate 114 and a second CLK contact 214 positioned on a backside of the substrate 114. Similarly, a second TSV 220 is electrically coupled to a first $\overline{\text{CLK}}$ contact 222 positioned on the circuit side of the substrate 114 and a second $\overline{\text{CLK}}$ contact 224 positioned on the backside of the substrate 114.

A first conductive line 230 is electrically coupled to the second $\overline{\text{CLK}}$ contact 224 and extends into the page behind the second CLK contact 214, as illustrated by the dotted line. A second conductive line 232 is electrically coupled to the first CLK contact 212 and extends into the page behind the first $\overline{\text{CLK}}$ contact 222.

The substrate 114 preferably comprises a bulk silicon substrate, but other substrates, such as GaAs, InP, Si/Ge, SiC, or the like, may also be used. Silicon-on-insulator (SOI) substrates may also be used. It should be noted that the substrate may also include other layers. For example, the substrate may include dielectric layers (e.g., inter-level dielectric layers, inter-metal dielectric layers, and the like), stress-inducing layers, conductive/metal layers, and/or the like. The substrate may further include one or more circuit sides wherein semiconductor devices, such as transistors, resistors, capacitors, and the like, may be formed. As such, the area within the twisted pair, referred to as the core of the twisted pair, may comprise different materials and be non-uniform.

The TSVs 210 and 220 may be formed by any suitable technique and of any suitable material(s). For example, the TSVs 210 and 220 may be formed by etching a via partially through the substrate and depositing a conducitve material therein, afterwhich the backside of the substrate may be thinned to expose the TSVs 210 and 220 on the backside of the substrate. In another technique, the TSVs 210 and 220 may be formed by etching a via partially through the substrate and depositing a dielectric layer in the via. In this embodiment, the dielectric layer within the via is removed after the backside of the substrate is thinned, and a conductive material is re-deposited within the via.

The TSVs 210 and 220 may be filled with a conductive material such as Al, Cu, other metals, alloys, doped polysilicon, combinations thereof, and the like. Preferably, the TSVs 210 and 220 are filled with metal. Furthermore, the TSVs 210 and 220 may have a liner, such as a barrier layer, preferably formed of a dielectric such as an oxide, nitride, or the like.

Semiconductor circuits, denoted generally as circuit 240, are manufactured by forming active regions in the substrate 114, depositing various insulating, conductive, and semiconductive layers over the substrate, and patterning them in sequential steps. Examples of the circuit 214 include one or more of transistors, capacitors, resistors, diodes, and the like.

FIG. 2 further illustrates an inter-layer dielectric (ILD) 250 overlying the substrate 114. The ILD 250 preferably comprises one or more layers of a dielectric material such as oxides, nitrides, phosphosilicate glass (PSG), borophosphosilicate glass (BPSG), fluorinated silicate glass or fluorinated silicon oxide glass (FSG) or any electrically isolating materials. The ILD 250 may include multiple layers with or without intermediate etch stop layers. Contacts (not shown) may be formed through the ILD 250 to interconnect metal interconnects (not shown) to the underlying circuit 240.

The backside of the substrate 114 is preferably covered with a passivation layer 252 to prevent contact with the semiconductor material of the substrate 114. The passivation layer 252 may be, for example, a plasma enhanced undoped silicate glass (USG) material or other dielectric material.

It should be noted that the TSVs 210 and 220 are illustrated as comprising a single plug extending from the ILD 250 to the backside of the substrate 114 for illustrative purposes only. As such, other embodiments may use multiple etching and/or deposition processes to form the TSVs 210 and 220, and the TSVs 210 and 220 may comprise a single plug extending from one or more dielectric layers overlying the ILD 250 to the backside of the substrate 114.

In an embodiment, the second CLK contact 214, the second $\overline{\text{CLK}}$ contact 224, and the conductive traces electrically coupled thereto (e.g., the first conductive line 230) may be formed on the passivation layer 252 along the backside of the substrate 114 using any suitable technique. In another embodiment, the second CLK contact 214 and the second $\overline{\text{CLK}}$ contact 224 are electrically bonded to a wiring substrate or another semiconductor device upon which the conductive traces are placed.

Figure 3:
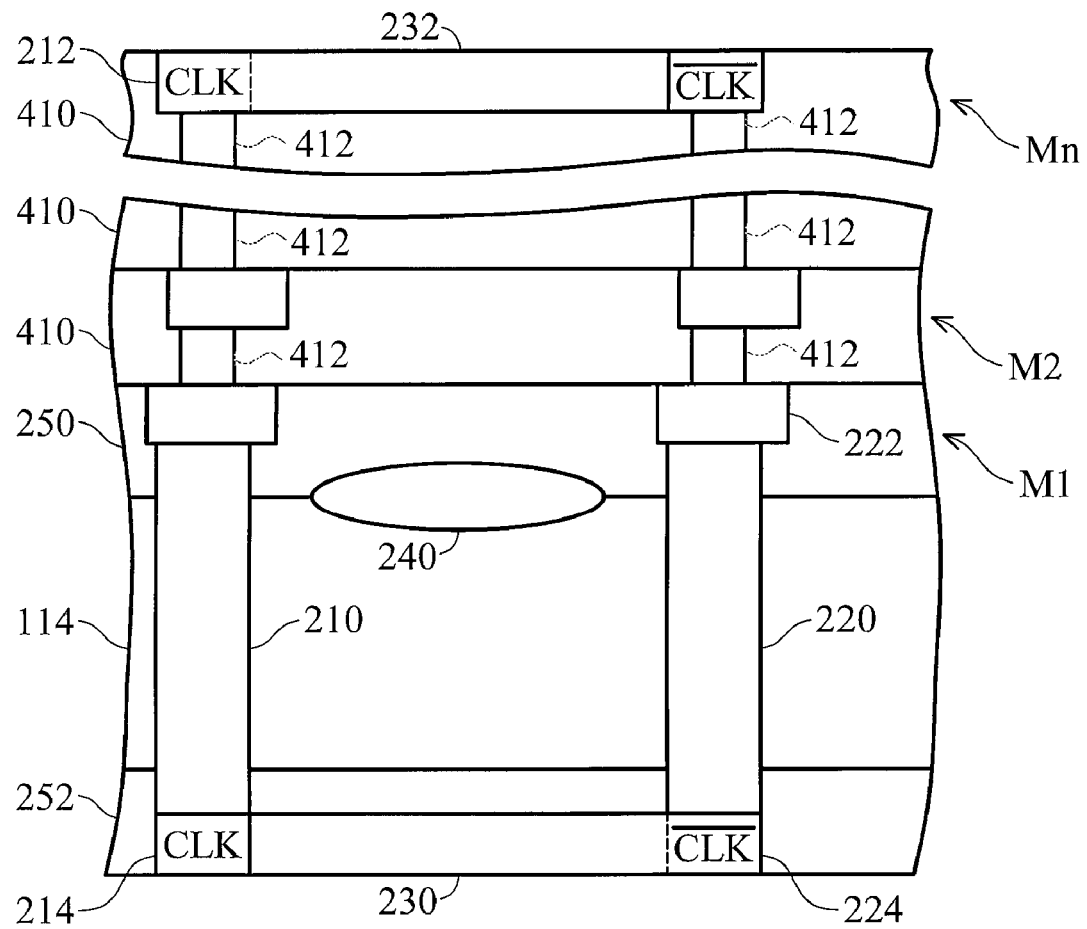
FIG. 3 is a cross section view of a portion of a twisted pair using through substrate vias in accordance with another embodiment of the present invention.

FIG. 3 illustrates an embodiment similar to the embodiment illustrated in FIG. 2, except that the second conductive line 232 is formed on a metal layer higher than metal layer M1. As one of ordinary skill in the art will appreciate, FIG. 2 illustrates an embodiment in which the conductive traces, such as the second conductive line 232, interconnecting TSVs for each signal of the pair of complementary signals is formed on the first metal layer M1. In other embodiments, the conductive traces may be formed in a different metal layer, such as metal layer Mn as illustrated in FIG. 3.

In this embodiment, one or more inter-metal dielectric (IMD) layers 410 are deposited over the ILD 250. The metal layers M2-Mn are formed in the IMD layers such that the metal layers M2-Mn are separated by dielectric material with vias 412 interconnecting respective portions of the metal layers M2-Mn. It should be noted that the IMD layers 410 may each comprise one or more layers of a dielectric material such as oxides, nitrides, phosphosilicate glass (PSG), borophosphosilicate glass (BPSG), fluorinated silicate glass or fluorinated silicon oxide glass (FSG) or any electrically isolating materials, with or without intervening etch stop layers.

It should also be noted that the conductive traces for complementary signals may be formed on different metal layers. For example, the conductive traces for the clock signal CLK may be formed on one metal layer and the conductive traces for the complementary clock signal $\overline{CLK}$ may be formed on a different metal layer. It should also be noted that the TSVs 210 and 220 are shown as extending into the substrate 114 from the IMD 250 for illustrative purposes only. In other embodiments, the TSVs 210 and 220 may extend into the substrate 114 from a surface of the substrate 114 or from a surface of one of the ILD layers 410.

Figure 4:
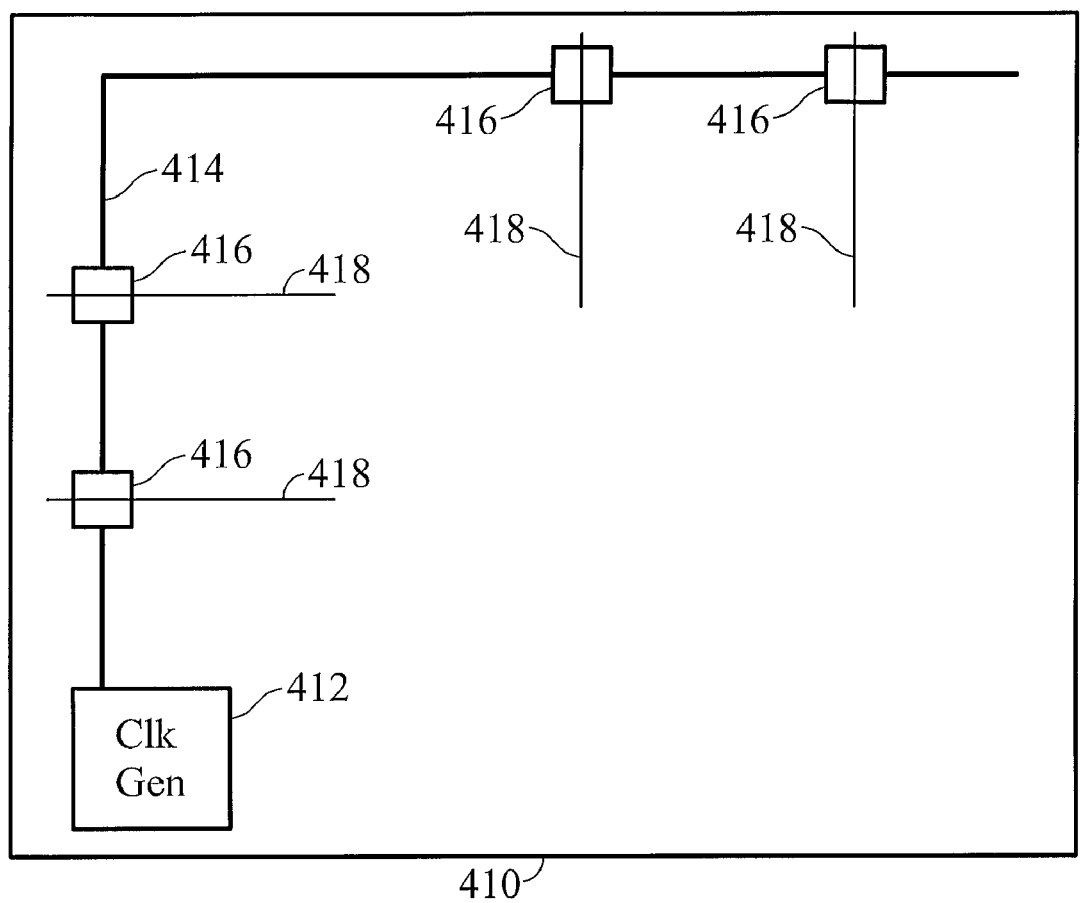
FIG. 4 is a plan view of an example of the use of a twisted pair using through substrate vias in accordance with an embodiment of the present invention.

FIG. 4 illustrates an example of the use of a twisted pair in accordance with an embodiment of the present invention. In this embodiment, a die 410 has formed thereon a clock generation circuit 412 for use with other electronic circuitry (not shown). The clock generation circuit 412 produces a twisted pair 414 comprising a clock signal CLK and a complementary clock signal $\overline{CLK}$. The clock signal CLK and the complementary clock signal $\overline{CLK}$ extend as the twisted pair 414 along the periphery of the die 410 (or a circuit), wherein the twisted pair 414 may be configured similar to one or more of the embodiments discussed above with reference to FIGS. 1-3. Taps 416 are placed periodically as required by the electronic circuitry to provide a clock signal 418 for operational timing.

The TSV-enabled twisted pair embodiments discussed above may reduce the crosstalk on the complementary signals. Furthermore, the characteristic impedance may be more easily tuned and may be tuned by thicknesses of the layers as well as the materials within the twists. As another advantage, active devices may be placed within the twists, thereby allowing the active devices and twisted pair signals to influence each other in a desired fashion.

Although the illustrative embodiment and its advantages have been described in detail, it should be understood that various changes, substitutions, and alterations can be made herein without departing from the spirit and scope of the invention as defined by the appended claims. For example, many of the features and functions discussed above can be implemented in software, hardware, or firmware, or a combination thereof. As another example, it will be readily understood by those skilled in the art that layer compositions may be varied while remaining within the scope of the present invention.

Moreover, the scope of the present application is not intended to be limited to the particular embodiments of the process, machine, manufacture, composition of matter, means, methods, and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An integrated circuit device comprising:
    a substrate having active regions formed in a portion thereof and active devices formed on a side thereof;
    a first conductive line having alternating sections on opposing sides of the substrate electrically coupled by through-substrate vias; and
    a second conductive line having alternating sections on opposing sides of the substrate electrically coupled by through-substrate vias, the first conductive line crossing the second conductive line relative to an axis orthogonal to a surface of the substrate when the first conductive line is on a different side of the substrate from the second conductive line.

2. The integrated circuit device of claim 1, wherein the first conductive line and the second conductive line include a clock signal and a complementary clock signal.

3. The integrated circuit device of claim 1, wherein sections of the first conductive line on a circuit side of the substrate are formed in a metal layer.

4. The integrated circuit device of claim 3, wherein the sections of the first conductive line on the circuit side of the substrate are electrically coupled to respective ones of the through-substrate vias by one or more vias extending between metal layers.

5. The integrated circuit device of claim 1, further comprising active devices formed within a core region of the first conductive line and the second conductive line.

6. The integrated circuit device of claim 1, wherein material in a core region of the first conductive line and the second conductive line is non-uniform.

7. An integrated circuit device comprising:
    a semiconductor substrate having a first side and a second side, active devices being formed on at least one of the first side and the second side;
    a first conductive line having a first section on the first side, a second section on the second side, and a third section on the first side, the first section being electrically coupled to the second section by a first through-substrate via (TSV), the second section being electrically coupled to the third section by a second TSV; and
    a second conductive line having a fourth section on the second side, a fifth section on the first side, and a sixth section on the second side, the fourth section being electrically coupled to the fifth section by a third TSV, the fifth section being electrically coupled to the sixth section by a fourth TSV, and the second conductive line and the first conductive line forming a twisted pair.

8. The integrated circuit device of claim 7, wherein sections of the first conductive line and the second conductive line positioned on a circuit side of the semiconductor substrate are formed in one or more metal layers overlying the semiconductor substrate.

9. The integrated circuit device of claim 7, further comprising one or more vias and metal layers interposed between the first section and the first TSV.

10. The integrated circuit device of claim 7, further comprising active devices formed within a core region of the twisted pair.

11. The integrated circuit device of claim 7, wherein a material in a core region of the twisted pair is non-uniform.

12. The integrated circuit device of claim 7, wherein the first conductive line and the second conductive line include a clock signal and a complementary clock signal.

13. An integrated circuit device comprising:
 a substrate, the substrate having one or more doped regions;
 a first electrical path comprising alternating sections on opposing sides of the substrate; and
 a second electrical path comprising alternating sections on opposing sides of the substrate, the first electrical path and the second electrical path alternately overlapping each other while on opposing sides of the substrate.

14. The integrated circuit device of claim 13, wherein the first electrical path includes a plurality of through-substrate vias interconnecting conductive regions on opposing sides of the substrate.

15. The integrated circuit device of claim 14, further comprising one or more vias and metal layers interposed between the conductive regions and the through-substrate vias.

16. The integrated circuit device of claim 13, further comprising active devices formed within a core region of a twisted pair formed by the first electrical path and the second electrical path.

17. The integrated circuit device of claim 13, wherein a material in a core region of a twisted pair formed by the first electrical path and the second electrical path is non-uniform.

18. The integrated circuit device of claim 13, wherein one of the first electrical path and the second electrical path includes a clock signal and a complementary clock signal.

* * * * *